United States Patent
Wolski et al.

(10) Patent No.: US 6,388,437 B1
(45) Date of Patent: May 14, 2002

(54) ERGONOMIC TEST APPARATUS FOR THE OPERATOR-ASSISTED TESTING OF ELECTRONIC DEVICES

(76) Inventors: Robert S. Wolski, 4325 Vale, Colorado Springs, CO (US) 80908; Forrest D. Titcomb, 4035 Sleeping Indian Lanae, Colorado Springs, CO (US) 80907

( * ) Notice: Subject to any disclaimer, the term of this patent is extended or adjusted under 35 U.S.C. 154(b) by 0 days.

(21) Appl. No.: 09/597,029

(22) Filed: Jun. 20, 2000

(51) Int. Cl.$^7$ .............................................. G01R 31/02
(52) U.S. Cl. ..................... 324/158.1; 324/760; 414/222
(58) Field of Search ........................... 324/158.1, 760; 250/548, 557; 414/222

(56) References Cited

U.S. PATENT DOCUMENTS

| | | | | |
|---|---|---|---|---|
| 4,532,423 A | * | 7/1985 | Tojo et al. ................... 250/310 |
| 4,757,255 A | * | 7/1988 | Margozzi ................. 324/158.1 |
| 4,856,904 A | * | 8/1989 | Akagawa ................. 324/158.1 |
| 5,166,606 A | * | 11/1992 | Blanz ....................... 324/158.1 |
| 5,604,444 A | * | 2/1997 | Harwood et al. ........... 324/754 |

* cited by examiner

Primary Examiner—Safet Metjahic
Assistant Examiner—Jimmy Nguyen
(74) Attorney, Agent, or Firm—Michael H. Jester

(57) ABSTRACT

An ergonomic tester for an electronic device under test (EDUT). A tester circuit card is disposed within an enclosed chassis for creating a plurality of predetermined test conditions for the EDUT. A monolithic fixture frame formed from a single piece of material provides unitary lateral supports with pivot points for an ergonomic loading handle assembly, a unitary fan support and a unitary base for supporting a monolithic translatable carriage for engaging and positioning the EDUT during loading and testing. A spring-probe block connector assembly is retained by the unitary lateral supports of the monolithic fixture frame to engage a mating connector in the EDUT when loaded. The spring-probe block connector assembly has one or more mechanical locating elements each for engaging a corresponding mechanical locating element in the EDUT. The ergonomic loading handle assembly is movably engaged to the monolithic fixture frame and rotatably engaged to the monolithic translatable carriage so that the loading handle is moveable from a loaded position to an unloaded position. A single movement of the loading handle urges the EDUT on the monolithic translatable carriage toward and into engagement with the spring-probe block connector assembly or away from and out of engagement with the spring-probe block connector assembly. A spring-loaded pin in the ergonomic loading handle assembly operates to retain the loading handle at the loaded position, whereby the EDUT is held engaged to the spring-probe block connector assembly for testing. The apparatus is modular and may be embodied as a multi-bay testing station.

20 Claims, 10 Drawing Sheets

ERGONOMIC TEST APPARATUS FOR THE OPERATOR-ASSISTED TESTING OF ELECTRONIC DEVICES

BACKGROUND OF THE INVENTION

1. Field of the Invention

This invention relates generally to testing apparatus for the operator-assisted testing of an electronic device under test (EDUT) and, more particularly, to a testing apparatus with an ergonomic handle assembly for EDUT loading and unloading with single operator motions.

2. Description of the Related Art

For electronic devices such as data storage tape and disk drives, performance testing is part of the usual factory quality-control process. Although many of the fabrication steps are completely automated, the quality-control testing procedures require the intervention of a human operator to transfer the electronic device under test (EDUT) from the assembly line to the testing station, to connect the various signal and power cables, to start the testing procedures and to remove the EDUT from the test station following the quality-control tests. Because the manufacturing rate and volume are very high for such electronic devices, these operator-assisted testing steps usually require rapid repetition of many stressful physical operations, which increases the incidence of repetitive-motion injuries. Intense competition among manufacturers strongly motivates the development and implementation of testing procedures that minimize unit manufacturing costs. Ergonomic operator procedures minimize operator injuries, thereby reducing overall manufacturing costs.

Moreover, in the usual practice, the test apparatus has several cables, which must be connected to and disconnected from hundreds of EDUTs each day. After tens or hundreds of thousands of load/unload cycles, the cables develop unpredictable failures, such as open-circuits, sporadic intermissions and short-circuits. Perhaps these failures are related to the cyclic mechanical bending of the cables as well as the tensile stress induced by pulling on the cable to disconnect the EDUT following testing. These sorts of failures can be very costly to the manufacturer because failing test cables can give erroneous quality control test results leading to a high rate of false-rejection and unnecessary rework. It is estimated that this situation alone costs one large data tape drive manufacturer millions of dollars per year in unneeded rework expenses.

Frequently, the forces required to manually connect and disconnect cable connectors to the EDUT are large. Sometimes the connector pins bind and disconnection forces as high as thirty pounds must be applied (in an awkward fashion) to overcome the binding forces. This disconnection force must be applied through the operator's fingertips while grasping the connector body to avoid pulling on the cable instead of the connector body itself Sudden disconnection under force causes sudden and uncontrolled motion by the operator's fingers and hands, which can cause pain and soft-tissue damage, especially when repeated hundreds of times throughout the day, every day.

It is desirable to resolve this problem by providing a testing apparatus with an ergonomic means for loading (connecting) and unloading (disconnecting) an EDUT. Such an ergonomic loading/unloading apparatus must limit the operator motion required to a single low-force controlled movement for loading and a similar movement during unloading, while avoiding unwanted strain to the cables and unwanted stress on the connectors. Until now, this has not been possible because of the well-known limitations discussed above. These unresolved problems and deficiencies are clearly felt in the art and are solved by this invention in the manner described below.

SUMMARY OF THE INVENTION

It is a purpose of this invention to provide an efficient and ergonomic apparatus for use in testing electronic devices in factories where they are manufactured. This invention can be used wherever electrical signal cables must be mated to electronic circuit boards with operator-assistance.

It is an advantage of this invention that it can be used to test tape drives, disk drives, compact disk reader (CDR) drives, digital versatile disk (DVD) drives, floppy drives and circuit boards.

It is another purpose of this invention to provide a testing apparatus that avoids stressing the electronic signal cables that are connected to the EDUT. All such cables are fixed to the tester apparatus and are not bent nor stressed unless the tester apparatus is disassembled for maintenance or repair. Thus, it is an advantage of this invention that the number of cable connector stress cycles is reduced by many hundreds of thousands of times over the life of the tester apparatus by using the spring-probe assembly of this invention, which is reliable over millions of connect/disconnect cycles.

In one aspect, the invention is an ergonomic testing apparatus for the operator-assisted testing of an electronic device under test (EDUT) having an enclosed chassis; one or more tester circuit cards disposed within the enclosed chassis for generating a plurality of electronic signals for use in creating a plurality of predetermined test conditions for the EDUT; connector means on the enclosed chassis for accepting an electronic connection from a remote host computer, thereby allowing the remote host computer to define at least one of the plurality of electronic signals; a monolithic fixture frame formed from a single piece of material and having a unitary base coupled to the enclosed chassis, unitary lateral supports, and a unitary fan support; a monolithic translatable carriage for supporting and positioning the EDUT during loading and testing, the monolithic translatable carriage being moveably-engaged to the unitary base of the monolithic fixture frame and having one or more fixed elements for mechanically engaging one or more corresponding elements in the EDUT, thereby locating the EDUT with respect to the monolithic translatable carriage; a spring-probe block connector assembly retained and disposed by the unitary lateral supports of the monolithic fixture frame to engage a mating connector in the EDUT when loaded, the spring-probe block connector assembly having one or more mechanical locating elements each for engaging a corresponding mechanical locating element in the EDUT during loading; an ergonomic loading handle assembly movably engaged to the unitary lateral supports of the monolithic fixture frame and rotatably engaged to the monolithic translatable carriage and having a loading handle moveable to a loaded position in a loading direction and moveable to an unloaded position in an unloading direction such that a single movement of the loading handle in the loading direction urges the EDUT on the monolithic translatable carriage toward and into engagement with the spring-probe block connector assembly and a single movement of the loading handle in the unloading direction urges the EDUT on the monolithic translatable carriage away from and out of engagement with the spring-probe block connector assembly; and a spring-loaded pin in the ergonomic loading handle assembly for retaining the loading handle at the loaded position, whereby the EDUT is held engaged to the spring-probe block connector assembly for testing.

It is another purpose of this invention to provide an ergometric loader for the tester apparatus. It is an advantage of this invention that force and impact applied to the operator's hands and wrists are dramatically decreased over the stress and impact produced with tester apparatus of the present art. In accordance with this invention, a single smooth low-force motion is sufficient to completely load the EDUT into the tester. Similarly, a smooth low-force movement in the opposite direction is sufficient to unload the EDUT completely from the tester.

In another aspect, the invention is an ergonomic EDUT loader for use in a testing apparatus with an enclosed chassis and a monolithic fixture frame formed from a single piece of material with a unitary base coupled to the enclosed chassis, unitary lateral supports, and a unitary fan support, where the ergonomic EDUT loader of this invention includes a monolithic translatable carriage for supporting and positioning the EDUT during loading and testing, the monolithic translatable carriage being moveably-engaged to the unitary base of the monolithic fixture frame and having one or more fixed elements for mechanically engaging one or more corresponding elements in the EDUT, thereby locating the EDUT with respect to the monolithic translatable carriage; a spring-probe block connector assembly retained and disposed by the unitary lateral supports of the monolithic fixture frame to engage a mating connector in the EDUT when loaded, the spring-probe block connector assembly having one or more mechanical locating elements each for engaging a corresponding mechanical locating element in the EDUT during loading; an ergonomic loading handle assembly movably engaged to the unitary lateral supports of the monolithic fixture frame and rotatably engaged to the monolithic translatable carriage and having a loading handle moveable to a loaded position in a loading direction and moveable to an unloaded position in an unloading direction such that a single movement of the loading handle in the loading direction urges the EDUT on the monolithic translatable carriage toward and into engagement with the spring-probe block connector assembly and a single movement of the loading handle in the unloading direction urges the EDUT on the monolithic translatable carriage away from and out of engagement with the spring-probe block connector assembly; and a spring-loaded pin in the ergonomic loading handle assembly for retaining the loading handle at the loaded position, whereby the EDUT is held engaged to the spring-probe block connector assembly for testing.

It is yet another purpose of this invention to provide a modular test apparatus suitable for use as a building block for creating a multi-bay test station for the asynchronous testing of a plurality of EDUTs simultaneously. In such a multi-bay test station, the individual test modes may differ and may be run asynchronously. Spring-probe blocks of different functionality may be used in each bay.

The foregoing, together with other features and advantages of this invention, can be better appreciated with reference to the following specification, claims and the accompanying drawing.

BRIEF DESCRIPTION OF THE DRAWINGS

For a more complete understanding of this invention, reference is now made to the following detailed description of the embodiments illustrated in the accompanying drawing, wherein like numerals represent like elements and.

DESCRIPTION OF THE PREFERRED EMBODIMENTS

Figure 1:
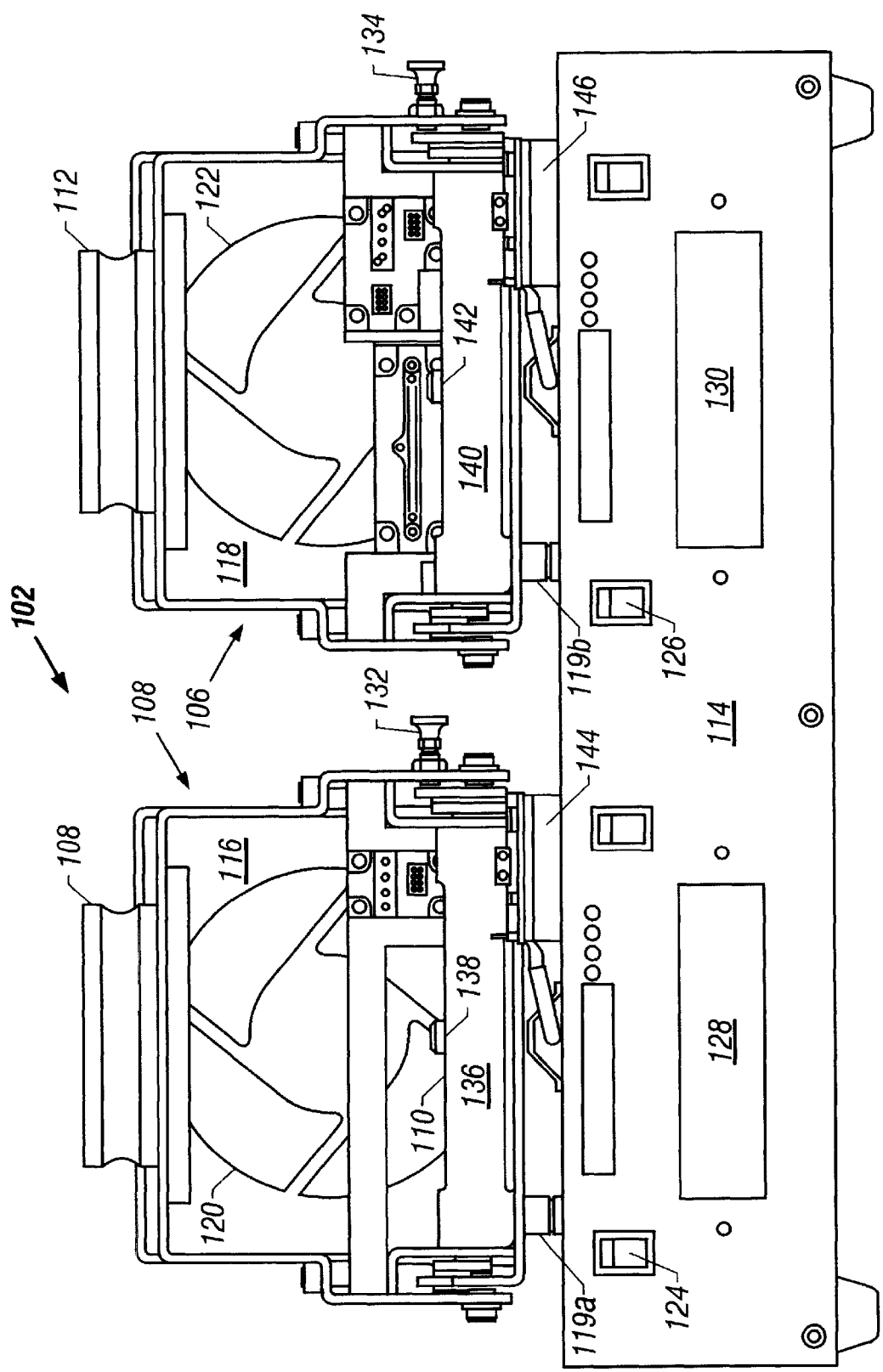
FIG. 1 shows a front view of an exemplary preferred embodiment of a dual-bay ergonomic testing apparatus of this invention showing both of the two loading handles in the loaded position.

FIG. 1 shows a front view of a dual-bay ergonomic testing apparatus 102 with a left testing bay 104 and a right testing bay 106. The left loading handle 108 is shown to be in the loaded position, whereby an electronic device under test (EDUT) (not shown) is firmly connected with the spring-probe block assembly 110 in left testing bay 104 for testing. The right loading handle 112 is also shown to be in the loaded position in FIG. 1. The illustration of left testing bay 108 omits certain details for simplicity. Spring-probe block assembly 110 can be better appreciated with reference to the description hereinbelow and to FIG. 7, which illustrates a spring-probe block assembly 700 of this invention. Dual-bay ergonomic testing apparatus 102 includes an enclosed chassis 114, which provides support for the various elements of dual-bay ergonomic testing apparatus 102, including the left monolithic fixture frame 116 and the right monolithic fixture frame 118. Monolithic fixture frames 116–118 are both supported and isolated from enclosed chassis 114 by means of several compliant shock-mounts exemplified in FIG. 1 by the front compliant supports 119A-B and in FIG. 2 by the rear compliant supports 219C-D. Monolithic fixture frames 116–118 can be better appreciated with reference to the description hereinbelow and to FIG. 8, which illustrates a monolithic fixture frame 800 of this invention. A reversible fan 120 is shown affixed to left monolithic fixture frame 116 to push and pull air through an EDUT (not shown) loaded into left testing bay 104 for testing. Similarly, another reversible fan 122 is shown affixed to right monolithic fixture frame 118 to push and pull air through an EDUT (not shown) loaded into right testing bay 106 for testing. The operator-activated control 124 is affixed to enclosed chassis 114 for selecting a predetermined test condition for an EDUT (not shown) loaded into left testing bay 104 for testing. Similarly, an operator-activated control 126 is affixed to enclosed chassis 114 for selecting a predetermined test condition for an EDUT (not shown) loaded into left testing bay 104 for testing. A storage bay 128 is provided in the front of enclosed chassis 114 for the handy storage of a removable data storage media cartridge of a type that may be accepted by an EDUT (not shown) when loaded in left testing bay 104 for testing. Similarly, a storage bay 130 is provided in the front of enclosed chassis 114 for the handy storage of a removable data storage media cartridge of a type that may be accepted by an EDUT (not shown) when loaded in right testing bay 106 for testing. The spring-loaded pin 132 operates to retain left loading handle 108 in the loaded position and the spring-loaded pin 134 operates to retain right loading handle 112 in the loaded position. A monolithic translatable carriage 136 is moveably-engaged to left monolithic fixture frame 116 and includes the fixed pin 138 for mechanically engaging a corresponding hole in an EDUT (not shown) so that such EDUT is located and engaged firmly by monolithic translatable carriage 136 during loading and unloading. Similarly, a monolithic translatable carriage 140 is moveably-engaged to right monolithic fixture frame 118 and includes the fixed pin 142 for mechanically engaging a corresponding hole in an EDUT (not shown) so that such EDUT is located and engaged firmly by monolithic translatable carriage 140 during loading and unloading. Finally, an infrared signal transceiver 144 is fixed to enclosed chassis 114 for exchanging infrared optical signals with an EDUT (not shown) when such EDUT is so equipped. Similarly, an infrared signal transceiver 146 is fixed to enclosed chassis 114 for exchanging infrared optical signals with an EDUT (not shown) when the EDUT is so equipped.

Figure 2:
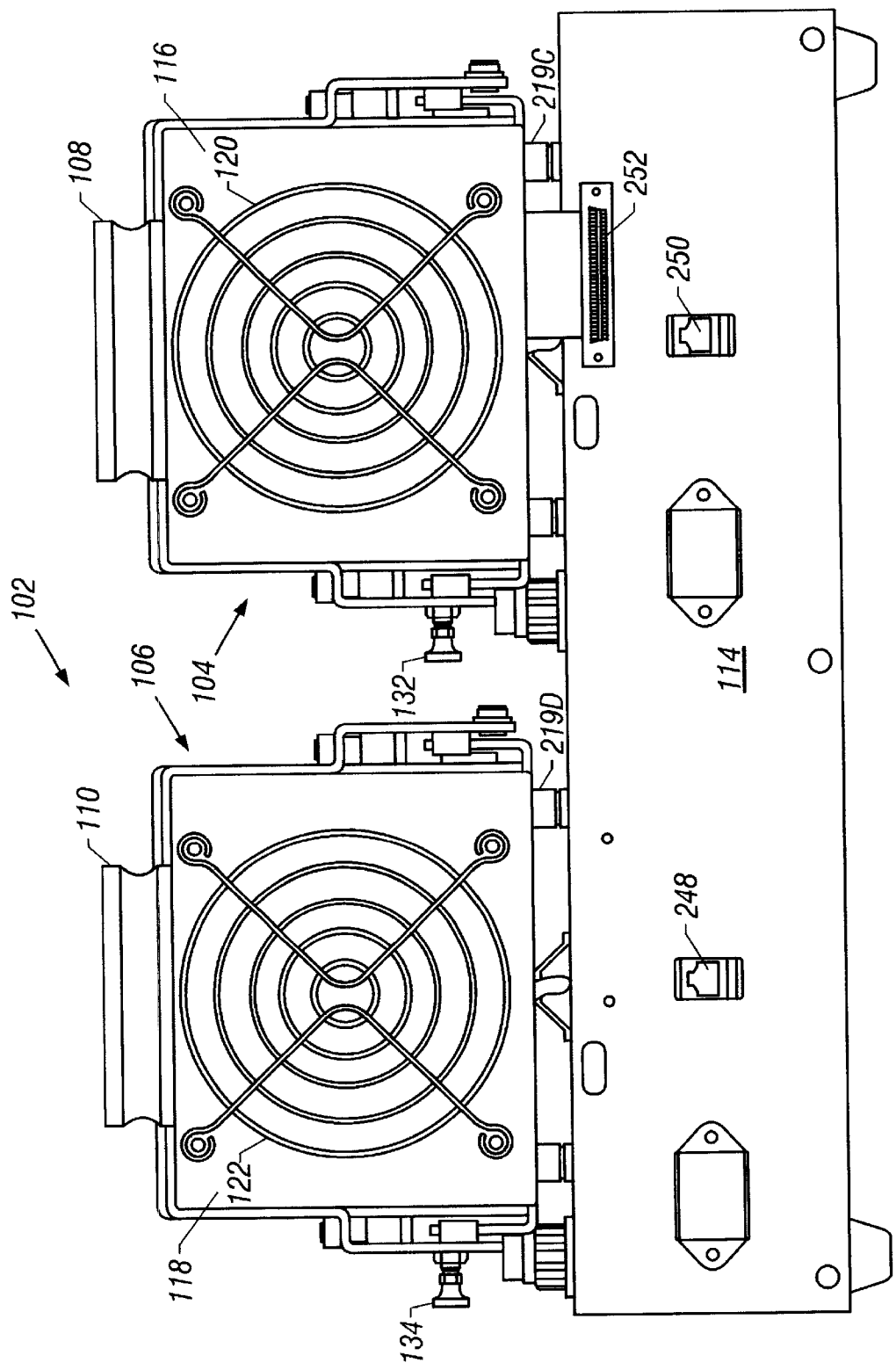
FIG. 2 shows a rear view of the dual-bay ergonomic testing apparatus embodiment of this invention from FIG. 1.

FIG. 2 shows a rear view of dual-bay ergonomic testing apparatus 102, wherein several of the elements discussed above in connection with FIG. 1 can also be seen and appreciated. A connector 248 is shown fixed to enclosed chassis 114 for making an electronic connection between right testing bay 106 and a remote host computer (not shown) to allow the remote host computer to communicate with right testing bay 106. Similarly, a connector 250 is shown fixed to enclosed chassis 114 for making an electronic connection between left loading handle 108 and a remote host computer (not shown) to allow such remote host computer to communicate with left loading handle 108. A rear external connector 252 is affixed to left monolithic fixture frame 116 to provide electronic signals to spring-probe block assembly 110 (FIGS. 1 and 3).

Figure 3:
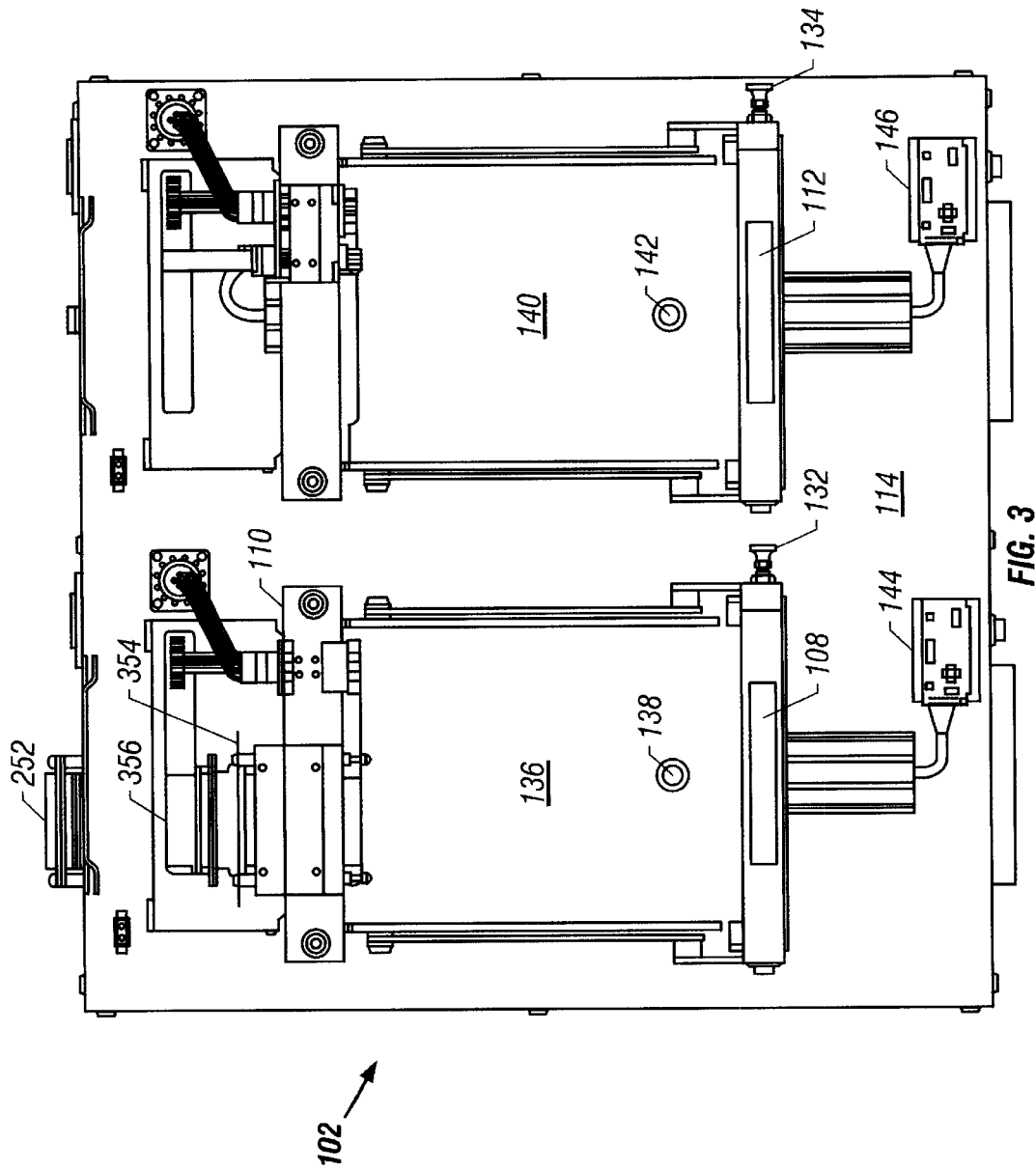
FIG. 3 shows a top view of the dual-bay ergonomic testing apparatus embodiment of this invention from FIG. 1.

FIG. 3 shows a top view of dual-bay ergonomic testing apparatus 102, wherein several of the elements discussed above in connection with FIGS. 1–2 can also be seen and appreciated. A compensator circuit board 354 is fixed to spring-probe block connector assembly 110 and includes electronic circuitry for selecting a particular connector in an EDUT (not shown) and for matching circuit impedances with the EDUT tester cable 356. Compensator circuit board 354 may also include conductor interconnections (not shown) for remapping a predetermined connector configuration to the particular EDUT connector (not shown) in any useful ways known in the art.

Figure 4:
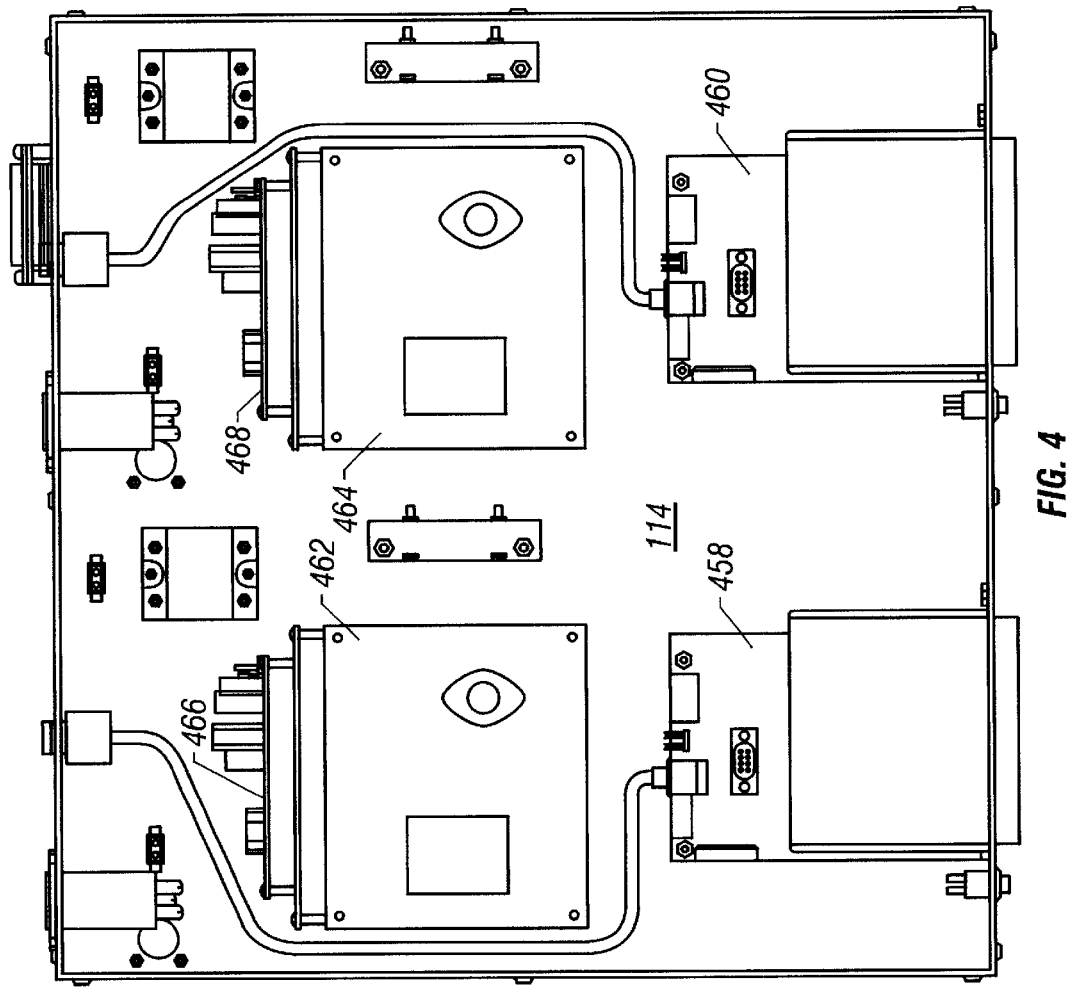
FIG. 4 shows a bottom view of the dual-bay ergonomic testing apparatus embodiment of this invention from FIG. 1.

FIG. 4 shows a bottom view of dual-bay ergonomic testing apparatus 102, wherein several of the elements discussed above in connection with FIGS. 1–3 can also be seen and appreciated. A tester circuit card 458 is shown fixed within enclosed chassis 114. Tester circuit card 458 generates a plurality of electronic signals for use in creating a plurality of predetermined test conditions for an EDUT (not shown) loaded into right testing bay 106. Connector 248 is connected to tester circuit card 458 to allow a remote host computer to communicate with tester circuit card 458 to define or select some of the electronic test signals. A second tester circuit card 460 is also shown fixed within enclosed chassis 114. Tester circuit card 460 generates a plurality of electronic signals for use in creating a plurality of predetermined test conditions for an EDUT (not shown) loaded into left testing bay 104. Connector 250 is connected to tester circuit card 460 to allow a remote host computer to communicate with tester circuit card 460 to define or select some of the plurality of electronic test signals. Tester circuit card 458 may include means for processing the infrared signals handled by infrared signal transceiver 144 (FIG. 1) and tester circuit card 460 may include means for processing the infrared signals handled by infrared signal transceiver 146 (FIG. 1). For each tester bay, a power supply circuit board, exemplified by the power supply circuit boards 462–464, is shown fixed to the underside of enclosed chassis 114 for producing a plurality of power supply voltages needed for the operation of tester 102 and the EDUT (not shown). Similarly, an individual power margin circuit board, exemplified by the power margin circuit boards 456–458, is shown fixed to enclosed chassis 114 adjacent to the respective power supply circuit board 462–464. Each of power margin circuit boards 456–458 is coupled to a respective one of spring-probe block connector assemblies (such as spring-probe block connector assembly 110 in FIGS. 1–2) for producing a plurality of predetermined combinations of power-supply voltage levels to the EDUT.

Figure 5:
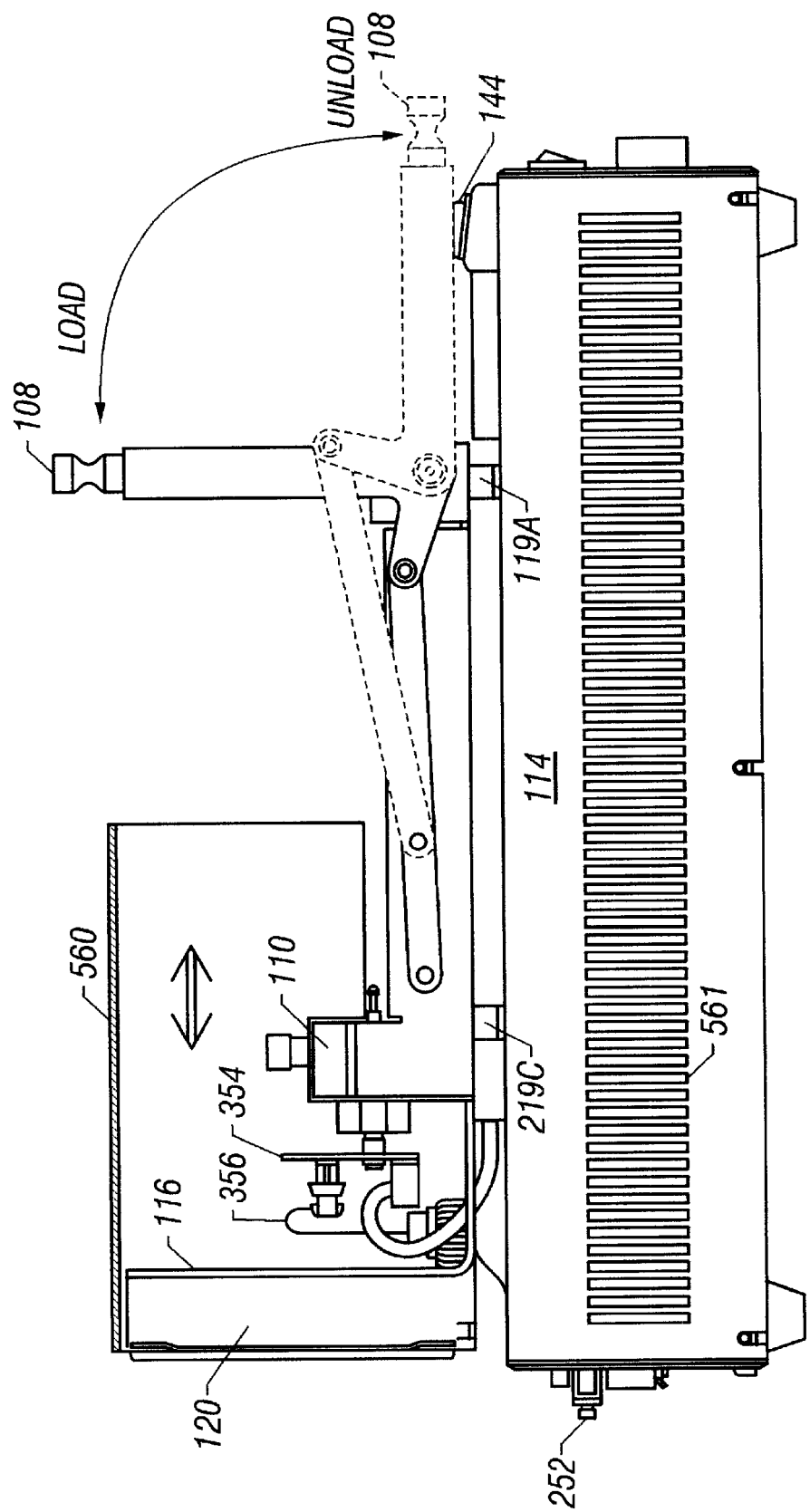
FIG. 5 shows a left side view of the dual-bay ergonomic testing apparatus embodiment of this invention from FIG. 1 with the loading handle in the unloaded position.
Figure 6:
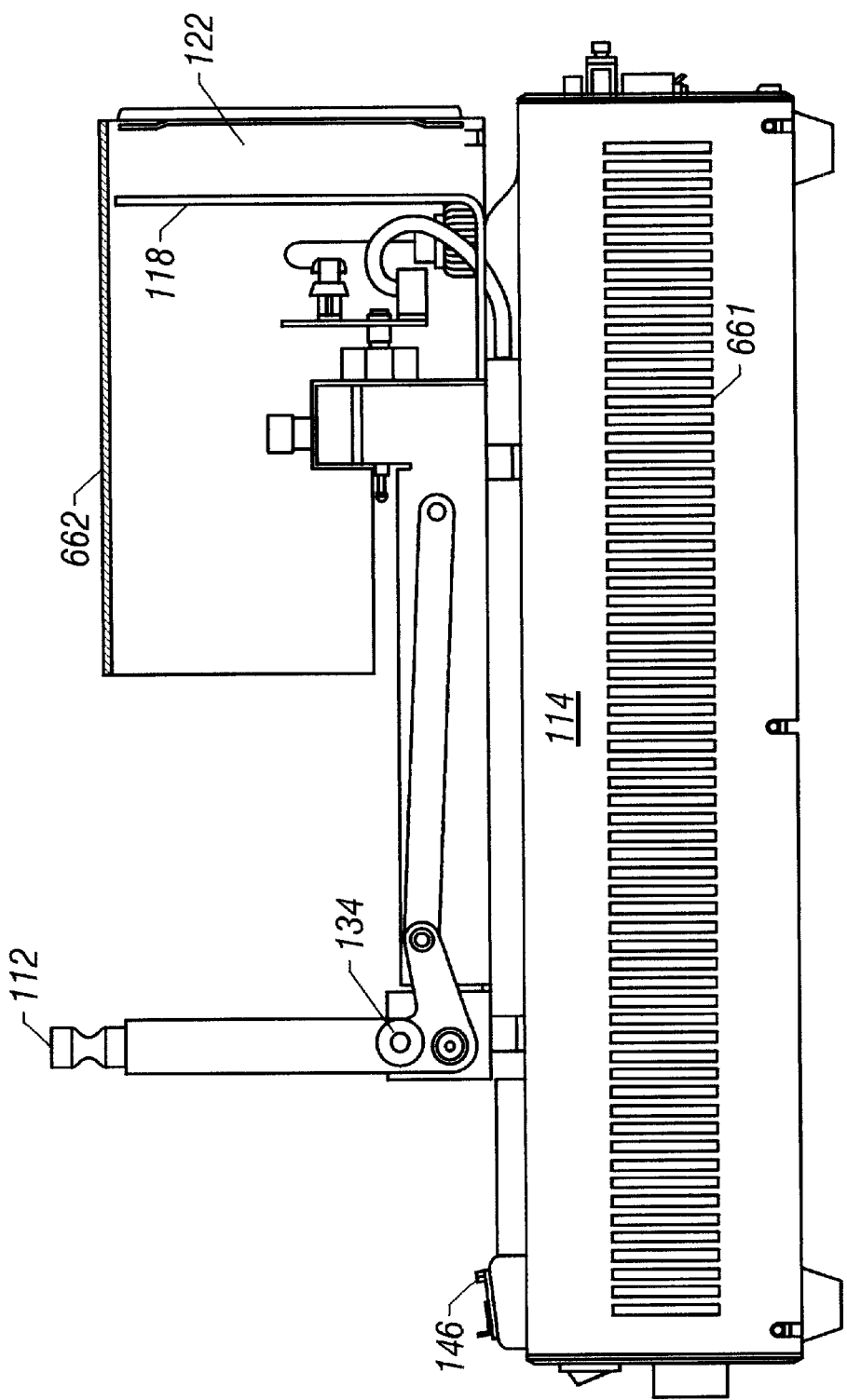
FIG. 6 shows a right side view of the dual-bay ergonomic testing apparatus embodiment of this invention from FIG. 1 with the loading handle in the loaded position.

FIG. 5 shows a left side view of dual-bay ergonomic testing apparatus 102, wherein several of the elements discussed above in connection with FIGS. 1–4 can also be seen and appreciated. Left loading handle 108 is illustrated as it appears in both the loaded position discussed above and in the unloaded position at which the EDUT (not shown) is decoupled from spring-probe block assembly 110 for disengagement with monolithic translatable carriage 136 (FIGS. 1–2) and removal from left testing bay 104. The air-flow bonnet 560 is shown disposed between reversible fan 120 and the EDUT (not shown) position for guiding air flow therebetween in either direction, which is readily appreciated with reference to the drawing. A plurality of ventilation perforations, exemplified by the a plurality of ventilation perforation 561, is shown for allowing the circulation of cooling air through enclosed chassis 114 responsive to an internal cooling fan (not shown). FIG. 6 shows a right side view of dual-bay ergonomic testing apparatus 102, wherein several of the elements discussed above in connection with FIGS. 1–5 can also be seen and appreciated. Right loading handle 112 is shown in the loaded position at which the EDUT (not shown) is fully coupled with the corresponding spring-probe block assembly (not shown) and locked into position by spring-loaded pin 134. The air-flow bonnet 662 is shown disposed between reversible fan 122 and the EDUT (not shown) position for guiding air flow therebetween in either direction, which is readily appreciated with reference to the drawing. A plurality of ventilation perforations, exemplified by the ventilation perforation 661, is shown for allowing the circulation of cooling air through enclosed chassis 114 responsive to an internal cooling fan (not shown). By comparing FIGS. 5 and 6, it can be readily appreciated that an EDUT may be loaded with a single movement of a single lever from the unloaded position to the loaded position, and unloaded with similar ergonomic ease.

Figure 7:
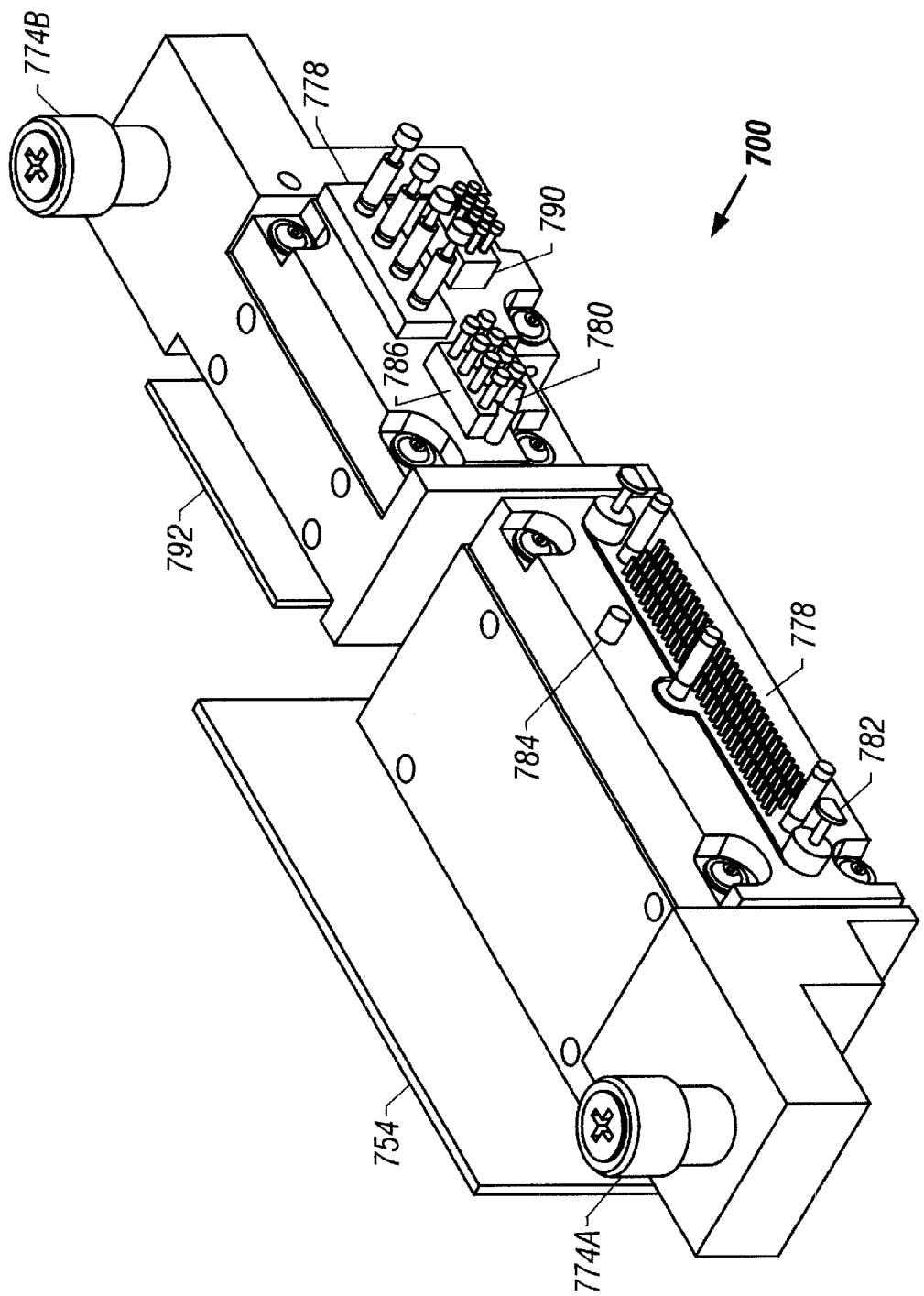
FIG. 7 shows a perspective view of an exemplary embodiment of the spring-probe block connector of this invention for a single-connector EDUT.

FIG. 7 shows spring-probe block assembly 700 of this invention. The two fasteners 774A-B operate to fix spring-probe block assembly 700 to the two unitary lateral supports 876A-B of monolithic fixture frame 800 (FIG. 8) so that the multi-pin connector 778 (which may be embodied as, for example, a SCSI connector of the type well-known in the art) is disposed to engage a mating connector in an EDUT (not shown) loaded into left testing bay 104 (FIGS. 1–3). Some EDUT designs may include more than one such mating connector and spring-probe block assembly 700 may be configured with the necessary plurality of multi-pin connectors represented by multi-pin connector 778 for testing such EDUT designs. Spring-probe block connector assembly 700 also includes one or more mechanical locating elements, exemplified by the mechanical locating element 780, each for engaging a corresponding mechanical locating element in an EDUT (not shown) during loading. One or more spring-loaded push-pin elements, exemplified by the push-pin element 782, are also provided to assist in connector separation during the unloading process. In addition to multi-pin connector 766, spring-probe block assembly 700 may also include optical connecting means exemplified by the optical coupler 784 when accommodating an EDUT (not shown) with mating optical connecting means. Also, FIG. 7 shows several other exemplary connector blocks that may be provided by spring-probe block assembly 700 of this invention, including the diagnostic signal port 786, the power supply connector 788, and the tape loader connector 790, all shown with several female connector pins of the type that are free to wobble slightly on spring-loaded suspensions to permit self-alignment with mating male connector pins (not shown) on the EDUT during loading. Finally, a compensator circuit board 754 is shown fixed to the rear of spring-probe block assembly 700 in a preferred position and a multiplexer circuit board 792 is also shown fixed to the rear of spring-probe block assembly 700 to facilitate electronic selection of one from among several different connections to the EDUT (not shown).

Figure 8:
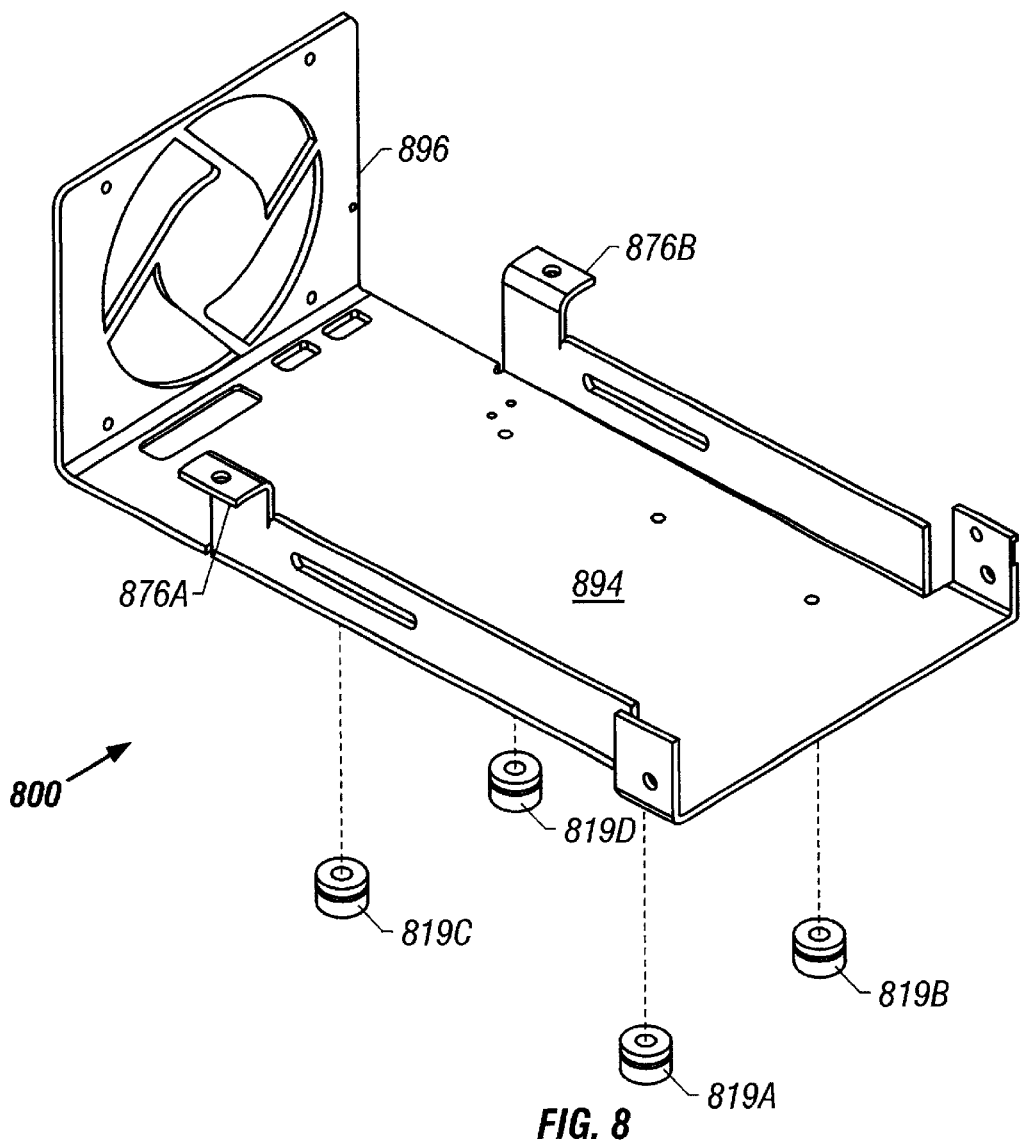
FIG. 8 shows a perspective view of an exemplary embodiment of the monolithic fixture frame of this invention.

FIG. 8 shows monolithic fixture frame 800 of this invention, which is fabricated from a single piece of sheet-metal or other suitable structural material and includes a unitary base 894 for coupling to enclosed chassis 114 (FIGS. 1–6) by means of the front compliant supports 819A-B and the rear 10 compliant supports 819C-D, a unitary fan support 896 for mounting reversible fan 120 (FIGS. 1–3), and twin unitary lateral supports 864A-B for holding spring-probe block assembly 110 (FIGS. 1–3) in position and for engaging the ergonomic loading handle assembly that embraces left loading handle 108 and its associated linkages with monolithic translatable carriage 136 (FIGS. 1–3).

Figure 9:
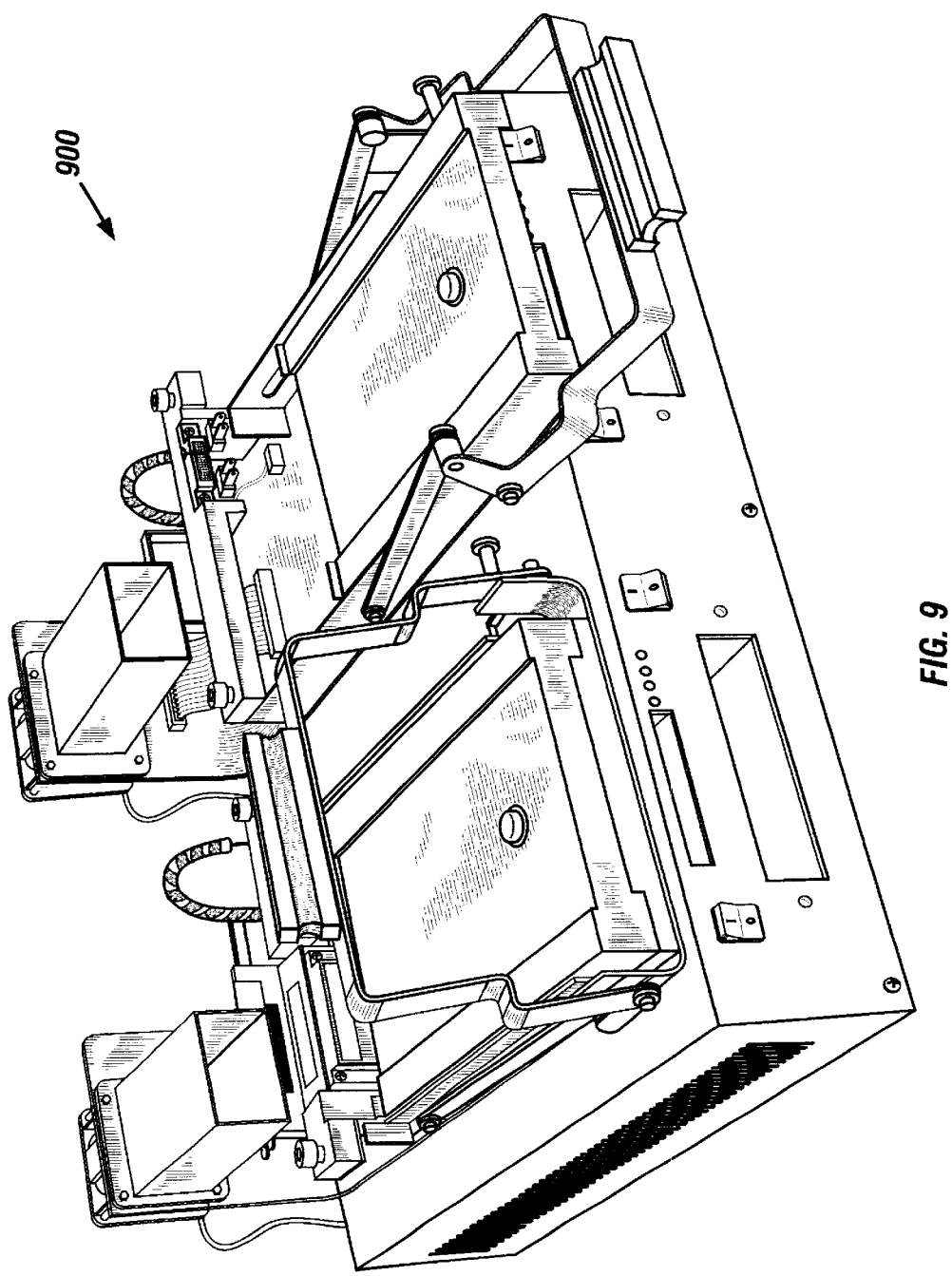
FIG. 9 shows a photograph of an exemplary preferred embodiment of a dual-bay ergonomic testing apparatus of this invention.
Figure 10:
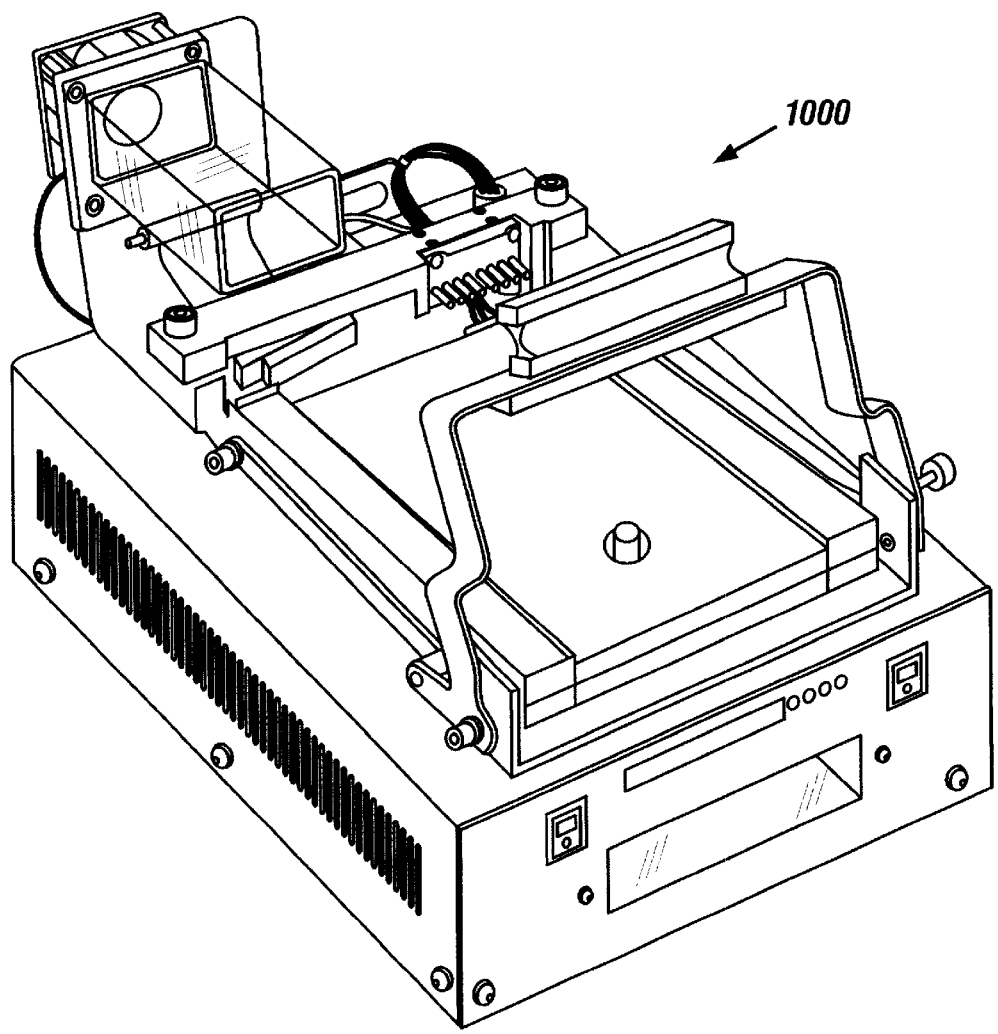
FIG. 10 shows a photograph of an exemplary preferred embodiment of a single-bay ergonomic testing apparatus of this invention from FIG. 1.

FIG. 9 shows a photograph of a model of a dual-bay ergonomic testing apparatus 900 of this invention. FIG. 10 shows a photograph of a model of an exemplary single-bay ergonomic testing apparatus 1000 of this invention.

Clearly, in view of these teachings, other embodiments and modifications of this invention may occur readily to those of ordinary skill in the art. Therefore, the invention is to be limited only by the following claims, which embrace all such obvious embodiments and modifications, viewed in conjunction with the above specification and accompanying drawing.

We claim:

1. An ergonomic testing apparatus for the operator-assisted testing of an electronic device under test (EDUT) loaded into the apparatus, the apparatus comprising:

an enclosed chassis having a plurality of ventilation perforations;

one or more tester circuit cards disposed within the enclosed chassis for generating a plurality of electronic signals for use in creating a plurality of predetermined test conditions for the EDUT;

connector means on the enclosed chassis for accepting an electronic connection from a remote host computer, thereby allowing the remote host computer to define at least one of the plurality of electronic signals;

a monolithic fixture frame formed from a single piece of material and having unitary lateral supports, a unitary fan support, and a unitary base coupled by means of compliant supports to the enclosed chassis;

a monolithic translatable carriage for supporting and positioning the EDUT during loading and testing, the monolithic translatable carriage being moveably-engaged to the unitary base of the monolithic fixture frame and having one or more fixed elements for mechanically engaging one or more corresponding elements in the EDUT, thereby locating the EDUT with respect to the monolithic translatable carriage;

a spring-probe block connector assembly retained and disposed by the unitary lateral supports of the monolithic fixture frame to engage a mating connector in the EDUT when loaded, the spring-probe block connector assembly having one or more mechanical locating elements each for engaging a corresponding mechanical locating element in the EDUT during loading;

an ergonomic loading handle assembly movably engaged to the unitary lateral supports of the monolithic fixture frame and rotatably engaged to the monolithic translatable carriage and having a loading handle moveable to a loaded position in a loading direction and moveable to an unloaded position in an unloading direction such that a single movement of the loading handle in the loading direction urges the EDUT on the monolithic translatable carriage toward and into engagement with the spring-probe block connector assembly and a single movement of the loading handle in the unloading direction urges the EDUT on the monolithic translatable carriage away from and out of engagement with the spring-probe block connector assembly; and a spring-loaded pin in the ergonomic loading handle assembly for retaining the loading handle at the loaded position, whereby the EDUT is held engaged to the spring-probe block connector assembly for testing.

2. The ergonomic testing apparatus of claim 1 further comprising:

an infrared signal transceiver fixed to the enclosed chassis for exchanging signals with the EDUT.

3. The ergonomic testing apparatus of claim 2 wherein the mating EDUT connector incorporates means for exchanging optical data, the apparatus further comprising:

optical connecting means in the spring-probe block connector assembly for making an optical data connection with the mating EDUT connector.

4. The ergonomic testing apparatus of claim 3 further comprising:

an EDUT tester cable coupled to the spring-probe block connector assembly for transferring electronic signals; and a compensator circuit fixed to the spring-probe block connector assembly for selecting one of a plurality of EDUT mating connectors and for matching circuit impedances between the EDUT tester cable and the one EDUT mating connector.

5. The ergonomic testing apparatus of claim 4 further comprising:

a reversible fan disposed in the unitary fan support of the monolithic fixture frame to push and pull air through the EDUT;

an air-flow bonnet disposed between the reversible fan and the EDUT for guiding air flow therebetween; and an operator-activated control fixed to the enclosed chassis for selecting at least one of the plurality of predetermined test conditions for the EDUT.

6. The ergonomic testing apparatus of claim 5 wherein the EDUT incorporates means for accepting a removable data storage media cartridge, the apparatus further comprising:

a power-margin circuit disposed within the enclosed chassis and coupled to the spring-probe block connector assembly for producing a plurality of predetermined combinations of power-supply voltage levels to the EDUT;

at least one storage bay disposed in the front of the enclosed chassis for storing at least one removable data storage media cartridge.

7. The ergonomic testing apparatus of claim 1 wherein the mating EDUT connector incorporates means for exchanging optical data, the apparatus further comprising:

optical connecting means in the spring-probe block connector assembly for making an optical data connection with the mating EDUT connector.

8. The ergonomic testing apparatus of claim 1 further comprising:

an EDUT tester cable coupled to the spring-probe block connector assembly for transferring electronic signals; and a compensator circuit fixed to the spring-probe block connector assembly for selecting one of a plurality of EDUT mating connectors and for matching circuit impedances between the EDUT tester cable and the one EDUT mating connector.

9. The ergonomic testing apparatus of claim 1 further comprising:

a reversible fan disposed in the unitary fan support of the monolithic fixture frame to push and pull air through the EDUT;

an air-flow bonnet disposed between the reversible fan and the EDUT for guiding air flow therebetween; and an operator-activated control fixed to the enclosed chassis for selecting at least one of the plurality of predetermined test conditions for the EDUT.

10. The ergonomic testing apparatus of claim 1 wherein the EDUT incorporates means for accepting a removable data storage media cartridge, the apparatus further comprising:

a power-margin circuit disposed within the enclosed chassis and coupled to the spring-probe block connector assembly for producing a plurality of predetermined combinations of power-supply voltage levels to the EDUT;

at least one storage bay disposed in the front of the enclosed chassis for storing at least one removable data storage media cartridge.

11. In a testing apparatus for the operator-assisted testing of an electronic device under test (EDUT), having an enclosed chassis with a plurality of ventilation perforations, and a monolithic fixture frame formed from a single piece of material and having unitary lateral supports, a unitary fan support, and a unitary base coupled by means of compliant supports to the enclosed chassis, an ergonomic EDUT loader comprising:

a monolithic translatable carriage for supporting and positioning the EDUT during loading and testing, the monolithic translatable carriage being moveably-engaged to the unitary base of the monolithic fixture frame and having one or more fixed elements for mechanically engaging one or more corresponding elements in the EDUT, thereby locating the EDUT with respect to the monolithic translatable carriage;

a spring-probe block connector assembly retained and disposed by the unitary lateral supports of the monolithic fixture frame to engage a mating connector in the EDUT when loaded, the spring-probe block connector assembly having one or more mechanical locating elements each for engaging a corresponding mechanical locating element in the EDUT during loading;

an ergonomic loading handle assembly movably engaged to the unitary lateral supports of the monolithic fixture frame and rotatably engaged to the monolithic translatable carriage and having a loading handle moveable to a loaded position in a loading direction and moveable to an unloaded position in an unloading direction such that a single movement of the loading handle in the loading direction urges the EDUT on the monolithic translatable carriage toward and into engagement with the spring-probe block connector assembly and a single movement of the loading handle in the unloading direction urges the EDUT on the monolithic translatable carriage away from and out of engagement with the spring-probe block connector assembly; and a spring-loaded pin in the ergonomic loading handle assembly for retaining the loading handle at the loaded position, whereby the EDUT is held engaged to the spring-probe block connector assembly for testing.

12. The ergonomic EDUT loader of claim 11 wherein the mating EDUT connector incorporates means for exchanging optical data, the loader further comprising:

optical connecting means in the spring-probe block connector assembly for making an optical data connection with the mating EDUT connector.

13. The ergonomic EDUT loader of claim 12 wherein the testing apparatus includes one or more tester circuit cards disposed within the enclosed chassis for generating a plurality of electronic signals for use in creating a plurality of predetermined test conditions for the EDUT and an EDUT tester cable coupled to the spring-probe block connector assembly for transferring electronic signals, the loader further comprising:

a compensator circuit fixed to the spring-probe block connector assembly for selecting one of a plurality of EDUT mating connectors and for matching circuit impedances between the EDUT tester cable and the one EDUT mating connector.

14. The ergonomic EDUT loader of claim 13 further comprising:

an operator-activated control fixed to the enclosed chassis for selecting at least one of the plurality of predetermined test conditions for the EDUT.

15. The ergonomic EDUT loader of claim 14 further comprising:

connector means in the enclosed chassis for accepting an electronic connection from a remote host computer, thereby allowing the remote host computer to define at least one of the plurality of electronic signals.

16. The ergonomic EDUT loader of claim 15 further comprising:

a power-margin circuit disposed within the enclosed chassis and coupled to the spring-probe block connector assembly for producing a plurality of predetermined combinations of power-supply voltage levels to the EDUT;

at least one storage bay disposed in the front of the enclosed chassis for storing at least one removable data storage media cartridge.

17. The ergonomic EDUT loader of claim 11 wherein the testing apparatus includes one or more tester circuit cards disposed within the enclosed chassis for generating a plurality of electronic signals for use in creating a plurality of predetermined test conditions for the EDUT and an EDUT tester cable coupled to the spring-probe block connector assembly for transferring electronic signals, the loader further comprising:

a compensator circuit fixed to the spring-probe block connector assembly for selecting one of a plurality of EDUT mating connectors and for matching circuit impedances between the EDUT tester cable and the one EDUT mating connector.

18. The ergonomic EDUT loader of claim 11 further comprising:

an operator-activated control fixed to the enclosed chassis for selecting at least one of the a plurality of predetermined test conditions for the EDUT.

19. The ergonomic EDUT loader of claim 11 further comprising:

connector means on the enclosed chassis for accepting an electronic connection from a remote host computer, thereby allowing the remote host computer to define at least one of the plurality of electronic signals.

20. The ergonomic EDUT loader of claim 11 further comprising:

a power-margin circuit disposed within the enclosed chassis and coupled to the spring-probe block connector assembly for producing a plurality of predetermined combinations of power-supply voltage levels to the EDUT;

at least one storage bay disposed in the front of the enclosed chassis for storing at least one removable data storage media cartridge.

* * * * *